United States Patent [19]

Amirante

[11] Patent Number: 4,511,979
[45] Date of Patent: Apr. 16, 1985

[54] PROGRAMMABLE TIME REGISTERING AC ELECTRIC ENERGY METER HAVING RANDOMIZED LOAD CONTROL

[75] Inventor: Dominic Amirante, Louisburg, N.C.

[73] Assignee: Westinghouse Electric Corp., Pittsburgh, Pa.

[21] Appl. No.: 411,220

[22] Filed: Aug. 25, 1982
(Under 37 CFR 1.47)

[51] Int. Cl.³ .................. G01R 11/57; G01R 11/24
[52] U.S. Cl. .................. 364/481; 364/464; 364/483; 364/492; 364/493; 307/40
[58] Field of Search .............. 364/464, 481, 483, 492, 364/493, 569; 307/39, 40

[56] References Cited

U.S. PATENT DOCUMENTS

| | | | |
|---|---|---|---|
| 4,135,101 | 1/1979 | Young et al. | 307/40 |
| 4,213,058 | 7/1980 | Townsend | 307/40 |
| 4,240,030 | 12/1980 | Bateman et al. | 324/110 |
| 4,283,772 | 8/1981 | Johnston | 364/483 |

Primary Examiner—Gary Chin
Assistant Examiner—Heather Herndon
Attorney, Agent, or Firm—William D. Lanyi

[57] ABSTRACT

An electric energy meter for measuring various parameters of electrical energy consumption during time differentiated billing rate periods, and for controlling a load. A clock produces periodic timing pulses which are accumulated to represent the current time. Stored within the meter are a plurality of preselected rate change control points defining time intervals and their associated billing rates, i.e. on-peak, mid-peak, and base. The current time is compared with each rate change control point until a time interval into which the current time falls is found. The rate change control point defining this time interval, designated the current rate change control point, controls accumulation of the energy consumption data in accord with its billing rate data code. The load control bit associated with the current rate change control point determines whether the load is to be shed or reconnected during the time interval the current rate change control point controls accumulation of the energy consumption data. The least significant digit of one of the registers accumulating the energy consumption data is read. This least significant digit, in conjunction with the load control bit, controls the shedding and reconnecting of the load during the aforementioned time interval.

8 Claims, 3 Drawing Figures

PROGRAMMABLE TIME REGISTERING AC ELECTRIC ENERGY METER HAVING RANDOMIZED LOAD CONTROL

BACKGROUND OF THE INVENTION

1. Field of the Invention

This invention relates, in general, to programmable time-registering meters for measuring AC electric energy consumption during time differentiated billing rate periods and for controlling a load. More specifically, this invention randomizes the timing of load shedding and reconnecting.

2. Description of the Prior Art

Electric energy billing meters of the electromechanical type are commonly used to measure the amount of electrical energy consumed at the premises of electric energy users. The electric energy supplier bills each user on the basis of the quantity of electric energy consumed during the billing period. Most billing meters in use today measure the total consumption of electric energy (kilowatt-hours) or a maximum peak demand (kilowatt demand) during a given time interval, usually a month. It is often desired to provide an electric energy meter for measuring both kilowatt-hour consumption and kilowatt demand and for separately totalizing these parameters as they are measured during different designated time intervals of each day. This method of metering is known as time-of-day or time-registering metering by those skilled in the art. The time-of-day intervals, typically three, generally reflect those times of the day when electric energy demand is at its highest, intermediate, or lowest level. The billing rates corresponding to these time intervals are usually designated as the on-peak rate, the mid-peak rate, and the base rate, respectively.

Induction watthour meters equipped with mechanical kilowatt-hour registers for measuring consumption during various time intervals of each day are known in the prior art. Selective operation of these registers is provided in response to mechanical time switch mechanisms. However, these mechanical registers and time mechanisms have limited measuring and accumulating capabilities with respect to daily time intervals and variations of these intervals between week days and weekend days. The recent application of solid-state electronic devices to time-registering meters has eliminated the need for mechanical registers and permitted an increase in the number of electrical energy parameters that can be measured. The result has been an increase in the number of rate selection schedules avilable to the utility and greater flexibility in their assignement.

One such solid-state time-of-day meter is disclosed in U.S. Pat. No. 4,283,772 which issued to Johnston on Aug. 11, 1981. This patent discloses a programmable time-registering AC electric energy meter including solid state logic circuitry with a programmed sequence of operation. The meter disclosed also provides for shedding and reconnecting a load at designated times of each day. Note this meter does not provide randomized load control and may therefore cause demand peaks due to simultaneous reconnection of many loads. These demand peaks could be lessened by providing a random time at which each load is to be shed and reconnected.

One common randomized load control method employs a resistor-capacitor timing circuit. A capacitor charges through a resistor, and a subsequent shed command causes the load to be shed for a time determined by the voltage across the capacitor. Variations in the values of the resistor and capacitor cause the loads to be reconnected to the system at varying times. Despite these variations, it has been found that use of RC timing circuits causes clusters of loads to be reconnected to the system within a very short interval. The result is a high differential power demand placed on the electrical energy system.

U.S. Pat. No. 4,213,058 discloses a technique for randomly reconnecting the load to an electrical energy system. When power consumption is excessive a central controller transmits a load shed command to various load management terminals. Upon receipt of the shed command, a load management terminal generates a reset pulse which sheds the load associated with that load management terminal and resets a binary counter. Resetting the binary counter enables the counter to then begin counting asynchronous clock pulses which are being continuously generated within the load management terminal; the clock signal has a period T. The positive going transition of the second clock pulse received by the binary counter after it has been reset inhibits receipt of further clock pulses and causes the load to be reconnected to the power system. As can be seen, the randomness associated with this timing cirucit is due to the uncertainty of whether the reset pulse will be received during a clock pulse or during the space between clock pulses. If the reset pulse should occur immediately before the positive going transition of a clock pulse, the load will be disconnected from the system for a time equal to the period of the clock pulse signal, i.e. T. If the reset pulse occurs immediately after the negative going transition of a clock pulse, the load will be disconnected for a time equal to $2 \times T$.

Another method for randomly controlling power system loads is illustrated by the load management terminal of U.S. Pat. No. 4,402,059 which issued to Kennon et al. on Aug. 30, 1983. When the load management terminal sheds a load, it calculates a random number and adds this random number to a predetermined shed time. The sum of these two numbers is loaded into a load control timer. The load control timer is counted down, and when it reaches zero the load is reconnected to the power system.

SUMMARY OF THE INVENTION

The present invention is a time-registering electrical energy meter for connecting to a utility's power distribution system for measuring various parameters of electrical energy consumption during various time intervals of each day. The time-of-day meter also provides load control based on load control data stored within its memory. The load control data causes the load associated with the time-registering meter to be shed from the power system during preselected intervals of each day. To avoid creating peak energy demands when loads are reconnected to the system, this invention discloses a novel means for randomizing load reconnections.

DESCRIPTION OF THE PREFERRED EMBODIMENT

The programmable time registering AC electric energy meter disclosed herein is similar in design and operation to the meter disclosed in the hereinbefore-mentioned U.S. Pat. No. 4,283,772, and this patent is hereby incorporated herein by reference. This patent may be referred to for additional information regarding part numbers and circuit configurations not considered to be novel features of the present invention. Detailed software flow charts are also presented in the above-identified patent.

Figure 1:
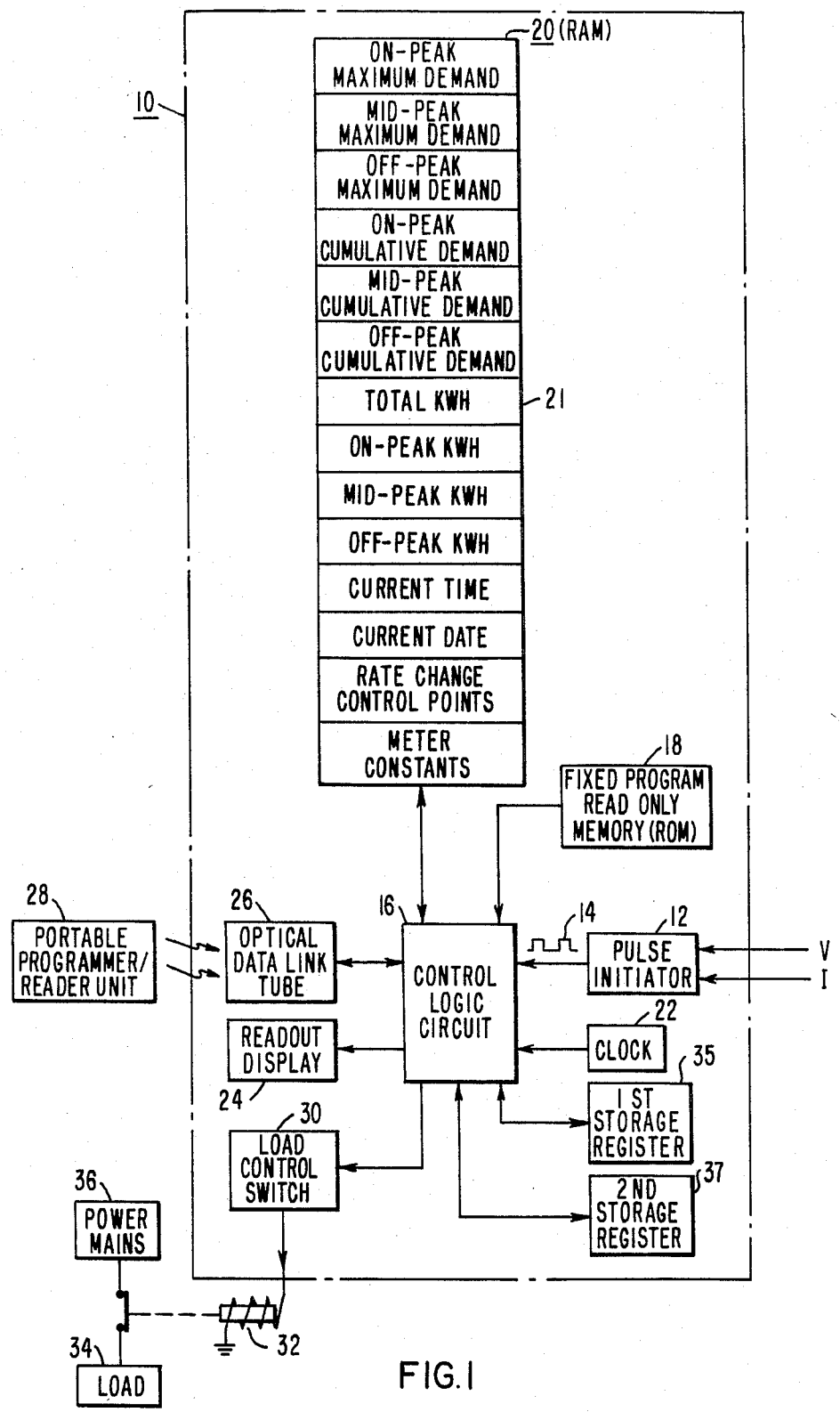
FIG. 1 is a block diagram of a time-registering AC electric energy meter constructed according to the teachings of the present invention.

FIG. 1 is a simplified block diagram of a programmable time-registering AC electric energy meter 10 constructed according to the teachings of the present invention. A pulse initiator 12 produces a metering pulse signal 14 having a pulse repetition rate responsive to the magnitude of an AC electric energy quantity to be measured. The pulse initiator produces the metering pulse signal 14 in response to a line voltage V and a line current I which define the AC electric energy quantity to be measured. The metering pulse signal 14 is input to a control logic circuit 16. As will be hereinafter explained, the control logic circuit 16 provides multi-function operations including accumulation of energy consumption data, communication with the outside world, and load control. Operation of the control logic circuit 16 is controlled by the software program in a fixed program read only memory (ROM) 18.

Also communicating with the control logic circuit 16 is a non-volatile random access memory 20 including a total kilowatt-hour register 21. As will be described below, the random access memory 20 stores, reads in, and writes out data related to electric energy consumption.

A clock 22 provides clock pulses to the control logic circuit 16. Under normal operations, clock pulses from the clock 22 are accumulated by the control logic circuit 16 and stored in the random access memory 20. This data is stored with a format of minutes, hours, day of the week, and day of the year. Also stored within separate registers of the random access memory 20 is the following consumption data: on-peak maximum demand, mid-peak maximum demand, base maximum demand, on-peak cumulative demand, mid-peak cumulative demand, base cumulative demand, total kilowatt hours, on-peak kilowatt hours, mid-peak kilowatt hours, and base kilowatt hours. The on-peak data represents consumption during those periods of each day when electrical energy demand is highest. Likewise, the mid-peak and base data represent consumption during those periods of each day when electrical energy demand is at an intermediate and lowest level, respectively. Throughout the description of the preferred embodiment and in the drawing, the terms "off-peak " and "base" are synonymous and used interchangeably. One function of the control logic circuit 16 is to determine to which of the aforementioned energy consumption data registers current energy consumption data is to be added. This determination is made on the basis of a plurality of rate change control points also stored within the random access memory 20. Each rate change control point defines a specific and predetermined minute, hour, day of the week, and day of the year. Each rate change control point also includes billing rate data (i.e. on-peak, mid-peak, or base) and load control data associated with the time interval defined by that rate change control point. In essence, the rate change control points divide the year into discrete time intervals and assign a billing rate period and load control operation to each interval.

Under normal operations of the meter 10, the control logic circuit 16 compares the current time and date stored in the random access memory 20 with each rate change control point to determine into which time interval the current time and date fits. The rate change control point defining this time interval becomes the current rate change control point. The billing rate associated with the current rate change control point determines whether the energy consumption data is to be accumulated in on-peak, mid-peak, or base registers of the random access memory 20.

The time and date data and each of the time related energy consumption parameters (kilowatt hours and kilowatt demand) are sequentially applied to a readout display 24 under control of the control logic circuit 16. The readout display 24 of the meter 10 sequentially shows time in hours and minutes, the day of the week, and the day of the year. It also displays the following accumulated electric energy consumption parameters: total kilowatt hours, kilowatt hours for the on-peak, mid-peak, and base periods; and kilowatt demand for the on-peak, mid-peak, and base periods. An optical data link tube 26 also communicates bidirectionally with control logic circuit 16. The optical data link tube 26 is disclosed in U.S. patent application No. 4,298,839 which issued to Johnston on Nov. 3, 1981. The optical data link tube 26 communicates with an external programmer-reader unit 28 via a plurality of opto-electronic devices to initialize, reprogram, and read the time and consumption data stored in the random access memory 20 of the meter 10. The portable programmer reader unit 28 is also utilized to perform various data verification and synchronization functions. Further information regarding the portable programmer reader unit 28 can be found in U.S. Pat. No. 4,291,375 which issued to Wolf on Sept. 22, 1981.

A load control switch 30 is responsive to the control logic circuit 16 for shedding and reconnecting an external load 34 to a power mains 36. A relay 32 is responsive to the load control switch 30 and in the normally closed position connects the load 34 to the power mains 36. When a shed or reconnect command is received by the load control switch 30, a random number is placed within the load control switch 30. This random number is decremented every second and when it reaches zero the relay 22 is energized and the load 34 disconnected from the power mains 36 if a shed command was received, or the relay 32 is de-energized allowing it to return to its normally closed position if a reconnect command was received. Further details of this scheme are disclosed in the discussion of FIG. 3.

A first storage register 35 and a second storage register 37 communicate with the control logic circuit 16 for storing load control data. The function of the first storage register 35 and the second storage register 37 is discussed in greater detail in association with FIG. 3.

Figure 2:
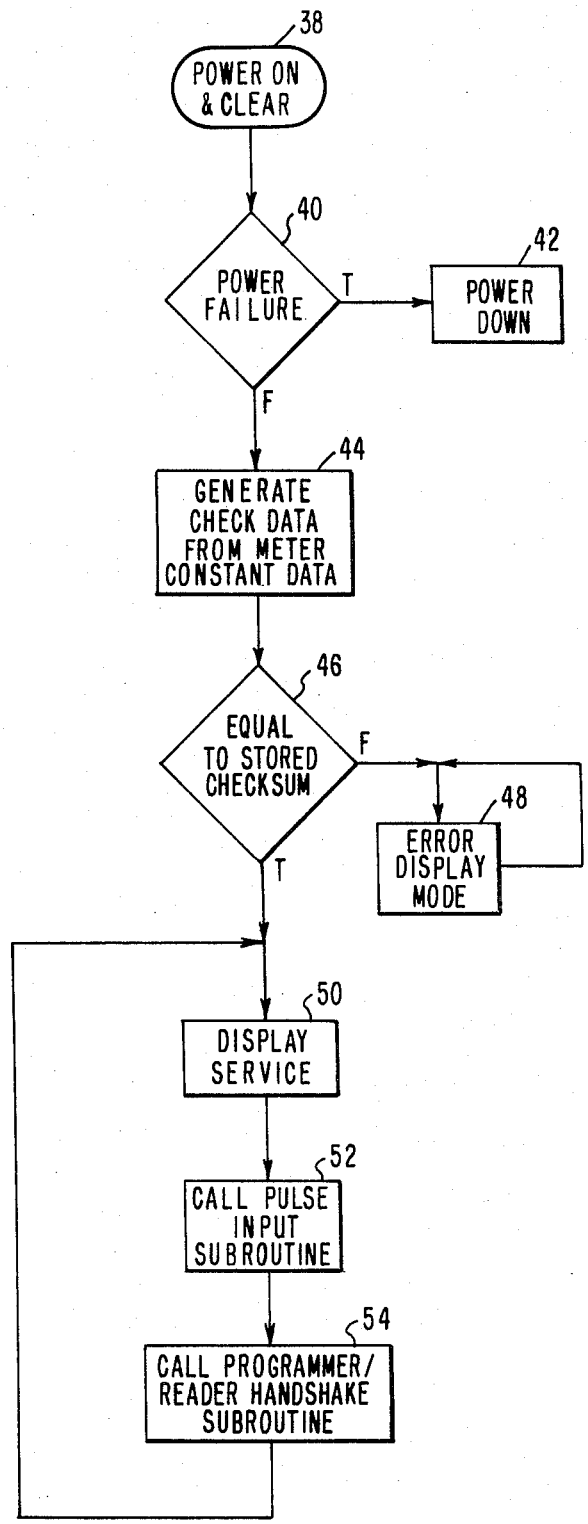
FIG. 2 is a flow chart illustrating the normal operating routine of the present invention.
Figure 3:
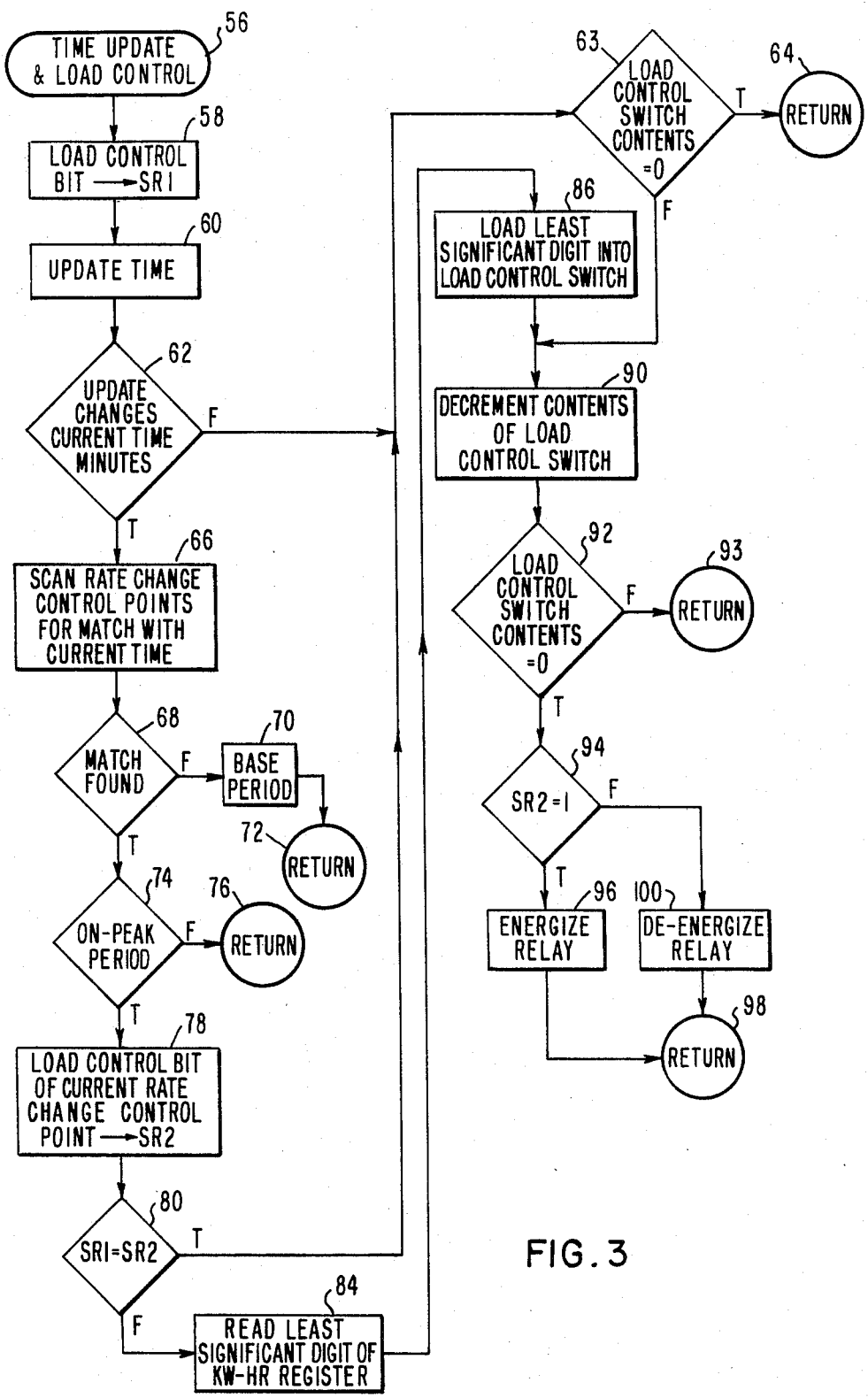
FIG. 3 is a flow chart illustrating the time update and load control subroutine of the present invention.

FIG. 2 shows the main program routine for the meter 10. The main routine is interrupted at one second intervals by the time update and load control routine shown in FIG. 3. The main routine of FIG. 2 and the time update and load control routine of FIG. 3 are both stored in the fixed program read only memory 18.

Referring now to FIG. 2, at initial power supply energization of the meter 10, the program begins at an entry point 38 with power on and clear operations. At a decision step 40, a check is made to determine whether a power failure is in progress. If there is a power failure, the meter 10 goes into a powered-down mode depicted by a step 42. In this mode, the meter 10 continues to update the current time from an internal battery source. If a power failure is not in progress, the control logic circuit 16 calculates check data from meter constant data stored in the random access memory 20. This process is depicted at a step 44. At a decision step 46, the check data generated at the step 44 are compared with check data stored in the random access memory 20. If the comparison indicates an inequality between the generated check data and the stored check data, an error display mode depicted at a step 48 is initiated.

If the result of the decision step 46 is true, the routine continues with the task of measuring and displaying energy consumption data. Display of the energy consumption and time data by the readout display 24, previously discussed with reference to FIG. 1, is depicted by a step 50 of the routine. Accumulation and storage of the metering pulse signal 14 and derivation of energy consumption data from the metering pulse 14 is depicted by a step 52. Upon receipt of an appropriate external signal the control logic circuit 16 calls a handshake subroutine allowing the meter 10 to communicate with the portable programmer-reader unit 28. Calling of the subroutine is indicated by a step 54 of FIG. 2. Under normal conditions, operation of the meter 10 continuously cycles through the display service of the step 50, the pulse input operation of the step 52, and when appropriate, the programmer-reader subroutine of the step 54. It should be reiterated, however, that operation of the meter is interrupted once every second to update the current time data stored in the random access memory 20.

In addition to the aforementioned time and billing rate data, each rate change control point also includes load control data. The load control data consists of a single binary digit which determines whether the load 34 is to be connected or disconnected from the power mains 36 in the time interval during which that rate change control point is controlling the accumulation of energy consumption data in the random access memory 20 (i.e. a current rate change control point). A binary one indicates the load 34 is to be shed and a binary zero indicates the load 34 is to be reconnected.

The time update and load control subroutine of FIG. 3 is entered once every second at an entry point 56. Prior to updating the time in accordance with the subroutine of FIG. 3, the load control bit of the current rate change control point is loaded into the first storage register 35. This operation is depicted at a step 58 of FIG. 3. At a step 60, the current time is updated by one second. A decision step 62 determines whether the most recent time update caused a change to the minutes portion of the current time. Since the lowest time denomination of the rate change control points is minutes, if there has been no change to the minutes portion of the current time the current rate change control point continues as such.

If the result of the decision step 62 is false, indicating no change to the minutes portion of the current time, it is then necessary to determine whether the load control function associated with the current rate change control point was previously accomplished. This determination is made at a decision step 63. If the contents of the load control switch 30 is zero, indicating completion of load control operations for the current rate change control point, the result at the decision step 63 is true, and processing returns to the main routine via an exit point 64. If the result at the decision step 63 is false, the contents of the load control switch is decremented at a step 90.

If the result of the decision step 62 is true, (i.e., the time update caused the minutes portion of the current time to change) processing progresses to a step 66 wherein each rate switch control point is checked to determine into which time interval the current time falls. If the current time does not fall within the time intervals defined by the plurality of rate switch control points, the result at a decision step 68 will be false. All energy consumption data is therefore accumulated in base period registers of the random access memory 20, as indicated by a step 70. Processing then returns to the main routine via an exit point 72 since no load control is provided during base rate periods. If the current time falls within a time interval defined by one of the plurality of rate change control points, processing moves to a decision step 74. Since load control is accomplished during only on-peak periods, the decision step 74 determines whether the current rate change control point defines an on-peak period. If the result at the decision step 74 is false, processing returns to the main routine via an exit point 76. Processing continues at a step 78 if the result of the decision step 74 is true. At the step 78, a load control bit of the current rate change control point is loaded into the second storage register 37. A decision step 80 compares the contents of the first storage register 35 (the load control bit of the previous rate change control point) and the second storage register 37 (the load control bit of the current rate change control point). If the contents are equal, indicating no change in the load control bit, the result at the decisions step 80 is true and processing advances to the decision step 64 where, as previously discussed, a determination is made regarding whether the load control operation for the current rate change control point has already been completed. If the outcome of the decision step 80 is false, the least significant digit of the kilowatt hour register 21 in the random access memory 20 is read. This operation is identified at a step 84 of FIG. 3. At a step 86 the least significant digit of the kilowatt hour register 21 is loaded into the load control switch 30. At the step 90, the value of the load control switch 30 is decremented; at a decision step 92, the contents of the load control switch 30 is compared with zero. If the outcome is false, meaning the load control switch 30 contents do not equal zero, processing returns to the main routine via an exit point 93. The contents of the load control switch 30 will be decremented during the next pass through the time update and load control subroutine. When the contents of the load control switch 30 is finally decremented to zero the result at the decision step 92 is true and processing continues to a decision step 94. If the contents of the second storage register 37 equals one, indicating the load 34 is to be shed, the result of the decision step 94 is true, the relay 32 is energized, as depicted at a step 96, and processing returns to the main routine at an exit point 98. If the contents of the second storage register 37 equals zero, the result of the decision step 94 is false. The relay 32 is deenergized and the load 34 reconnected to the power mains 36, as depicted at a step 100; processing then returns to the main routine at the exit point 98.

Since the contents of the kilowatt-hour register 21 control the shed and reconnect time of the load 34, the time at which the load is shed or reconnected to the power main 36 is random. As previously mentioned, this avoids creating peaks in power demand caused when many loads are simultaneously switched onto the power system. Although any storage register of the random access memory 20 could be used as the random shed time, the total kilowatt-hour register 21 was chosen in this embodiment since its value changes most frequently. Also, the total kilowatt hour register 21 changes at a different rate at each customer's premises. Therefore, selection of the customer who would be first to have his load de-energized during a particular on-peak period is random, and the first customer to experience deenergization differs from one on-peak period to the next. Further, use of the constantly changing total kilowatt hour register 21 for load control provides the utility with an opportunity to program a predetermined percent of load to be controlled at any one time. Because the present invention utilizes hardware available in present day programmable AC electric energy meters, it is easily adaptable to them.

It should be noted that there are, in effect, two degrees of load control associated with the meter 10. The first is selection of the load control bit of each rate change control point. Only the rate change control points delineating on-peak periods include a load control bit. For each rate change control point this bit can be a one, indicating a load shed, or a zero, indicating a load reconnection. The second degree of load control is the randomness associated with the least significant digit of the total kilowatt hour register 21.

Although the embodiment previously described establishes a shed and a reconnect time equal to the least significant digit of the total kilowatt hour register 21, other embodiments based on this same digit can be utilized. For instance, the subroutine software can provide for an immediate load shed if the least significant digit of the total kilowatt hour register 21 is odd. When these loads are later reconnected, the remaining loads are shed.

The discussion of the software flow charts illustrated in FIGS. 2 and 3 are intended for purposes of illustration and not limitation. It is anticipated that other alternate embodiments of the present invention may be conceived or the location of instructions regarding load control and the randomness associated with it changed from that shown in the flow charts discussed. Any such alternate embodiments are believed to fall within the scope and spirit of the present invention as claimed hereinafter.

What is claimed is:

1. An electrical energy meter for connecting to a power distribution system for measuring parameters of electrical energy usage in accord with time differentiated billing rate periods and for controlling a load, said meter comprising:
    clock means for producing periodic timing pulses;
    first means for accumulating said timing pulses in a manner representative of a current time;
    second means for storing a plurality of preselected rate change control points, each of said plurality of rate change control points comprising a time data code, a billing rate data code, and a load control data code;
    comparator means for periodically comparing said current time with said time data code of each one of said plurality of rate change control points, and for selecting a current rate change control point from said plurality of rate change control points when said current time is equal to the time data code of one of said plurality of rate change control points;
    means for producing metering pulses representative of electrical energy usage;
    third means for accumulating said metering pulses, said third accumulating means comprising a plurality of storage registers;
    control logic means for producing a billing rate control signal in response to a billing rate data code associated with said selected current rate change control point, said billing rate control signal controlling accumulation of said metering pulses in a preselected one of said plurality of storage registers of said third accumulating means, said control logic means comprising means for selecting a least significant digit of one of said plurality of storage registers of said third accumulating means;
    means for storing said selected least significant digit in a load control switch;
    means for periodically decrementing said load control switch; and
    means for selectably shedding and reconnecting a load when said load control switch is equal to a preselected value based on the binary status of said load control data code associated with said selected current rate change control point.

2. The electrical energy meter of claim 1 wherein the plurality of storage registers of the third accumulating means comprises a total kilowatt-hour register and wherein the control logic means selects a least significant digit of said kilowatt-hour register.

3. The electrical energy meter of claim 1 wherein the least significant digit of one of the plurality of storage registers of the third accumulating means determines a delay time for selectably shedding and reconnecting the load.

4. The electrical energy meter of claim 1 wherein the load control data code represents a command to shed or reconnect the load.

5. The electrical energy meter of claim 4 wherein a binary one represents a shed command and a binary zero represents a reconnect command.

6. The electrical energy meter of claim 4 wherein the load control switch is enabled to shed the load by the shed command and enabled to reconnect said load by the reconnect command, and wherein the least significant digit determines the exact time at which said load will be shed or reconnected.

7. An electrical energy meter for measuring electrical energy consumption, comprising:
    means for providing periodic timing pulses;
    first means for accumulating said timing pulses as a measure of current time;
    means for storing a plurality of rate change control points, each of said plurality of rate change control points comprising a time data code; a billing rate code and a load control data code;
    means for periodically comparing said current time with said time data code of each one of said plurality of rate change control points;
    means for selecting a current rate change control point from said plurality of rate change control points when said current time is equal to the time data code of said selected current rate change control point;

first means for producing metering pulses that are representative of electrical energy consumption;

second means for accumulating said metering pulses, said second accumulating means comprising a plurality of storage registers;

second means for producing a billing rate control signal in response to a billing rate data code associated with said selected current rate change control point, said billing rate control signal determining the accumulation of said metering pulses in a preselected one of said plurality of storage registers of said second accumulating means, said second producing means comprising means for selecting a least significant digit of one of said plurality of storage registers of said second accumulating means;

means for storing said selected least significant digit in a load control switch;

means for periodically decrementing said load control switch; and means for selectably shedding and reconnecting a load when said load control switch is equal to a preselected value based on the binary value of said load control data code associated with said selected current rate change control point.

8. The meter of claim 7, wherein:

said load control data code represent a command to selectably shed or reconnect said load.

* * * * *